United States Patent
Dowland et al.

(10) Patent No.: US 7,243,038 B2
(45) Date of Patent: Jul. 10, 2007

(54) METHOD AND APPARATUS FOR TESTING CIRCUIT BOARDS

(75) Inventors: David A. Dowland, Sachse, TX (US); J. Brent Nolan, Heath, TX (US)

(73) Assignee: Dowtech, Inc., Wylie, TX (US)

( * ) Notice: Subject to any disclaimer, the term of this patent is extended or adjusted under 35 U.S.C. 154(b) by 147 days.

(21) Appl. No.: 10/821,083

(22) Filed: Apr. 8, 2004

(65) Prior Publication Data

US 2005/0197797 A1 Sep. 8, 2005

Related U.S. Application Data

(60) Provisional application No. 60/549,997, filed on Mar. 4, 2004.

(51) Int. Cl.
*G01L 25/00* (2006.01)

(52) U.S. Cl. ..................................... 702/115

(58) Field of Classification Search ................. 702/115
See application file for complete search history.

(56) References Cited

U.S. PATENT DOCUMENTS

| | | | |
|---|---|---|---|
| 3,185,927 A | 5/1965 | Margulis et al. | |
| 3,246,544 A | 4/1966 | Cooper et al. | |
| 4,074,188 A * | 2/1978 | Boatman et al. | ............ 324/537 |
| 4,255,851 A | 3/1981 | Fortuna | |
| 4,437,229 A | 3/1984 | Bitler et al. | |
| 4,568,879 A | 2/1986 | Nakamura et al. | |
| 4,850,754 A | 7/1989 | Thornton et al. | |
| 5,204,912 A | 4/1993 | Schimanski | |
| 5,416,428 A | 5/1995 | Swart | |
| 6,396,295 B1 | 5/2002 | Robinson et al. | |
| 6,819,120 B2 * | 11/2004 | Tam | ........................... 324/633 |
| 2004/0130318 A1 * | 7/2004 | Saltsov et al. | ......... 324/207.17 |

* cited by examiner

*Primary Examiner*—John Barlow
*Assistant Examiner*—Aditya S. Bhat
(74) *Attorney, Agent, or Firm*—Beem Patent Law Firm

(57) ABSTRACT

A system and method for inductance testing a planar magnetic circuit in a board having a pair of contacts that may include a core; a pair of leads; a controller for contacting the pair of leads with the pair of contacts, registering the core with the planar magnet circuit, and delivering an electrical current through the planar magnetic circuit while the core enhances inductance in said planar magnetic circuit; and an inductance measuring tool. In another aspect, a system and method for high potential testing a planar magnetic circuit that may include providing an electrically isolated bed, loading the board on the bed, providing a pair of leads, contacting the pair of leads with the pair of contacts using a controller, delivering an electric current having a predetermined voltage between about 1,000 and about 30,000 volts through the planar magnetic circuit; and determining whether the board withstands the predetermined voltage. In another aspect, a plurality of beds may register a plurality of planar magnetic circuits.

20 Claims, 9 Drawing Sheets

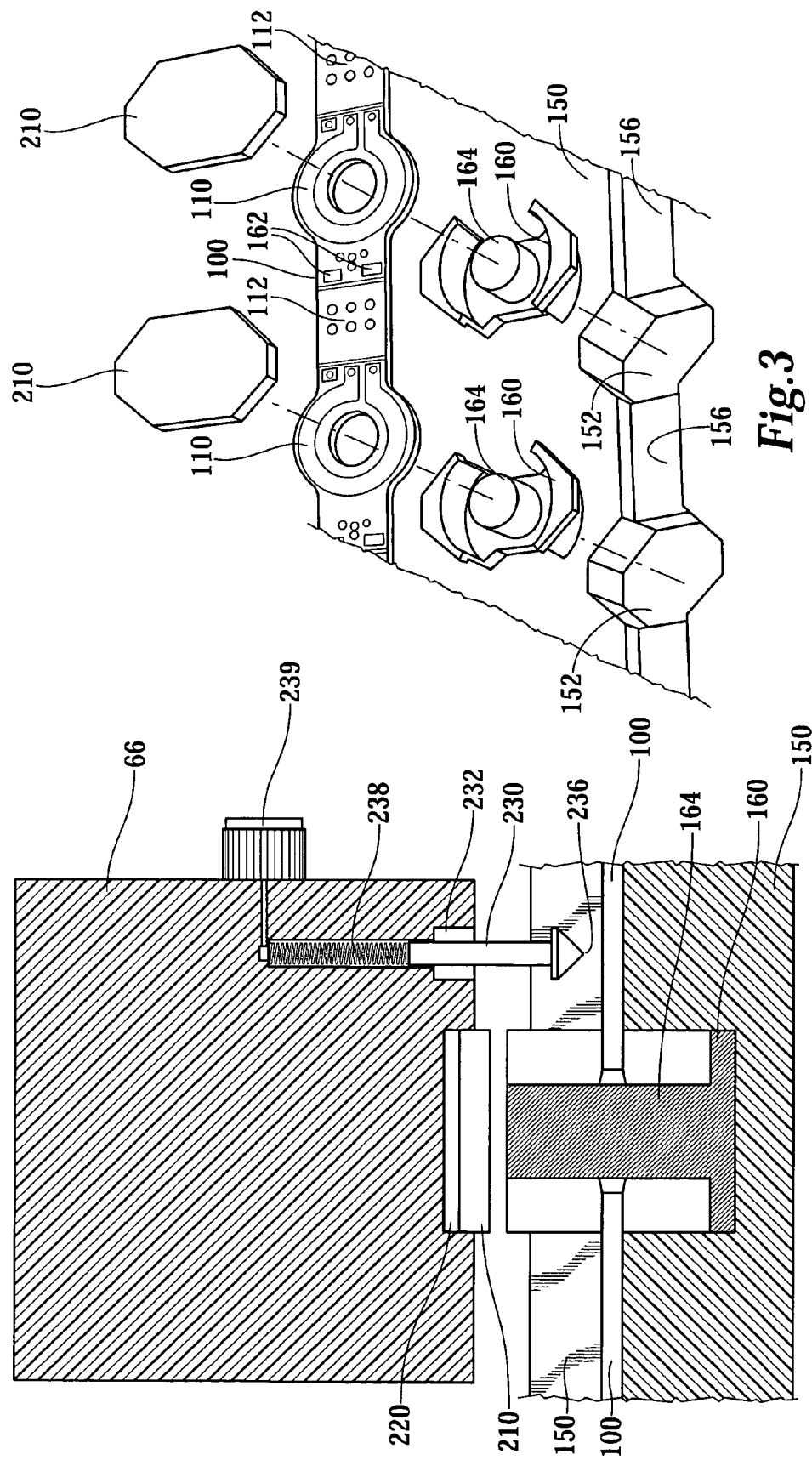

METHOD AND APPARATUS FOR TESTING CIRCUIT BOARDS

This application claims the benefit of U.S. Provisional Application No. 60/549,997, filed Mar. 4, 2004.

BACKGROUND OF THE INVENTION

1. Field of the Invention

The present invention relates to the testing of printed circuit boards, and more specifically the testing of circuit boards by administering one or more electrical tests under automated control and distinguishing between passed and failed circuit boards.

2. Background of the Invention

Circuit boards, i.e., printed circuit boards or PCBs, in general may be tested by administering electrical tests during manufacturing. For example, U.S. Pat. No. 6,396,295 teaches a method of administering a test to an integrated circuit and determining whether the integrated circuit passes or fails the test.

The evolution and advancement of circuit board and electronic technology has brought about the need for new or additional tests that may be difficult, or impossible, with existing testing equipment. Many tests may be conducted by human operators because no existing automated equipment may be able to conduct the required tests.

For example, technologies such as planar magnetics may require inductance testing using ferrite cores and high voltage potentials, e.g., 2,000 volts or more. Existing automated testing equipment, e.g., flying probe testers and bed-of-nails testers, may not be capable of testing at high potentials and with cores. In addition, existing testing equipment may not be fully automated and may require human operators to perform one or more steps for each circuit test, which may lower overall manufacturing and testing efficiency. For example, a human operator may be able to test only 1,000 to 2,000 planar magnetic circuit boards per day for inductance and high potential while production needs may be 100,000 to 300,000 circuit boards per day.

Existing testing methods may be so time consuming and expensive so that, in order to be cost effective, only samples of lots and not each individual circuit board may be tested. One to three hundred defective circuit boards may be missed for every million defective circuit boards that are identified. Since, for example, a single circuit board design may be produced, currently at global levels, in quantities of 100 million or more per year, 10,000 or more defective circuit boards may be allowed to pass though quality review and then further processed, used, or sold to manufactures and end-users.

Each defective circuit board allowed though testing, processing, and eventually sold may require hours of the end-manufacturer's or end-user's time identifying and repairing the problem, potentially costing much more in lost productivity than the production cost of the original defective board.

What is needed is a system for more effectively and more economically testing circuit boards.

BRIEF SUMMARY OF THE INVENTION

A system for inductance testing a plurality of planar magnetic circuits may include a substrate; a plurality of cores spaced and electrically isolated from one another and mounted on the substrate, wherein each one of the plurality of cores registers with a corresponding one of the plurality of planar magnetic circuits; a pair of leads; a controller for selecting one of the plurality of planar magnetic circuits, contacting the pair of leads with the selected planar magnetic circuit, and delivering an electrical current through the selected planar magnetic circuit while the corresponding registered core enhances inductance in the selected planar magnetic circuit; and an inductance measuring tool. The system may further include a plurality of beds in the substrate for registering the plurality of planar magnetic circuits with the plurality of cores.

Another aspect may be a system for inductance testing a planar magnetic circuit in a board having a pair of contacts that may include a core; a pair of leads; a controller for contacting the pair of leads with the pair of contacts, registering the core with the planar magnet circuit, and delivering an electrical current through the planar magnetic circuit while the core enhances inductance in the planar magnetic circuit; and an inductance measuring tool. Furthermore, at least a part of the core may be compressibly mounted.

Still another aspect may be a system for high potential testing a plurality of boards each one having at least one planar magnetic circuits with a pair of contacts, that may include a substrate having a plurality of electrically isolated beds for receiving said plurality of boards; a pair of leads; a controller for selecting one of the planar magnetic circuits and contacting the pair of leads with a corresponding pair of contacts for the selected planar magnetic circuit; a high potential testing tool for delivering a predetermined voltage between about 1,000 volts and about 30,000 volts through the selected planar magnetic circuit and determining whether the selected planar magnetic circuit withstands the predetermined voltage. Alternatively, the predetermined voltage may be between about 2,000 volts and about 3,000. In addition, the system may further include a means for subsequently identifying the selected planar magnetic circuit if the selected planar magnetic circuit fails to withstand the predetermined voltage.

Yet another aspect may be an apparatus for inductance testing boards having planar magnetic circuits that may include a substrate, a plurality of cores spaced and electrically isolated from one another and mounted on the substrate, and a plurality of beds on the substrate for receiving the boards and registering the planar magnetic circuits with respect to the plurality of cores.

A further aspect may be a method for inductance testing a board having a planar magnetic circuit and a pair of contacts, including the steps of: providing a substrate having an electrically isolated core and bed; loading the board on the bed to register the planar magnetic circuit the said core; providing a pair of leads and a plate; contacting the pair of leads with the pair of contacts and the plate with the core using a controller; delivering an electrical current through the planar magnetic circuit while the plate and the core enhance inductance in the planar magnetic circuit; measuring inductance in the planar magnetic circuit; and determining whether the inductance is in a predetermined range. The method may further include ablating at least a portion of the board if the inductance is not in the predetermined range. A board may be approved by this method.

The method may still further include analyzing the board to identify a defect if the inductance is not in the predetermined range and improving a design of the board to overcome the defect. A board also may be improved by this method.

Yet another aspect may be a method of high potential testing a board having a planar magnetic circuit with a pair of contacts, including the steps of: providing a substrate having an electrically isolated bed; loading the board on the bed; providing a pair of leads; contacting the pair of leads with the pair of contacts using a controller; delivering an electric current having a predetermined voltage between about 1,000 and about 30,000 volts through the planar magnetic circuit; and determining whether the board withstands the predetermined voltage. Alternatively, the predetermined voltage may be between about 2,000 and about 3,000 volts. The method may further include ablating at least a portion of the board if the inductance is not in the predetermined range. Furthermore, a board may be approved by this method.

The method may still further include analyzing the board to identify a defect if the board does not withstand the predetermined voltage and improving a design of the board to overcome the defect. A board also may be improved by this method.

BRIEF DESCRIPTION OF THE DRAWINGS

FIG. 2 is a cross-section view of a tester and a jig in accordance with the invention.

FIG. 3 is an exploded view of a jig, core, and circuit board.

DETAILED DESCRIPTION OF THE INVENTION

1. Overview

A circuit board may be tested through one or more electrical tests by an automated machine. Approved, non-defective, circuit boards may be subsequently identified from defective circuit boards, so that approved circuit boards may be processed, used, or sold. In another aspect, defective circuit boards may be destroyed or otherwise rendered unserviceable.

A system or means for testing circuits boards may meet one or more of the following criteria: it may be more cost effective than current means and systems; it may allow one more tests to be conducted including high potential, inductance, capacitance, conductance, and resistance; it may test every circuit board manufactured or processed; passed circuit boards may be clearly distinguished or identified from defective circuit boards, e.g., by making defective circuit boards unserviceable, e.g., by destroying defective circuit boards; it may be safety interlocked; if adapted to or used to upgrade existing equipment, it may not seriously affect the existing equipments ability to perform its original function, e.g., adding testing functionality to a PCB drilling machine should not disable the drilling function; it should may be automated and require minimal human intervention; and it may increase testing accuracy and yield over semi-automated methods or human performed tests.

Figure 1:
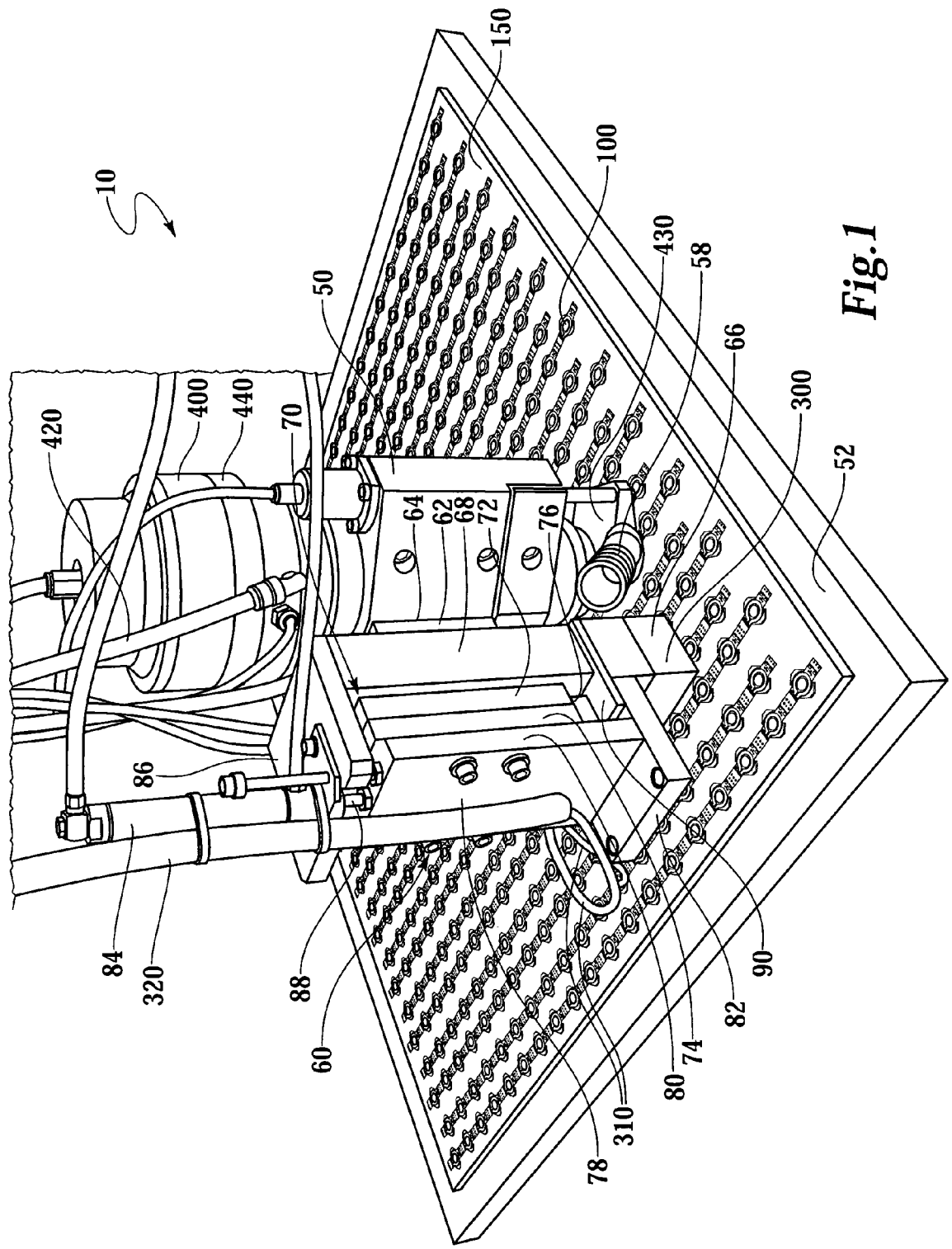
FIG. 1 is a perspective view of a testing machine in accordance with the invention.

In one embodiment, a controller or computer controlled tester head and drill on a movable carriage, e.g., using the apparatus shown in FIG. 1, a testing machine 10, may implement testing. Testing machine 10 may perform one or more electrical tests including but not limited to high potential, resistance, inductance, capacitance, and conductance.

Testing machine 10, FIG. 1, may include a carriage 50 movable on one or more axes with respect to a circuit board 100. For example, carriage 50 may be movable, i.e., translated, on an x-, y-, and z-axis. Testing machine 10 may include one or more testers 60 for performing electrical tests of circuit boards 100, e.g., an inductance tester or a high potential or dielectric withstand tester. Testers 60 may be mounted to carriage 50 and be movable in one or more axes with respect to circuit board 100.

Figure 6:
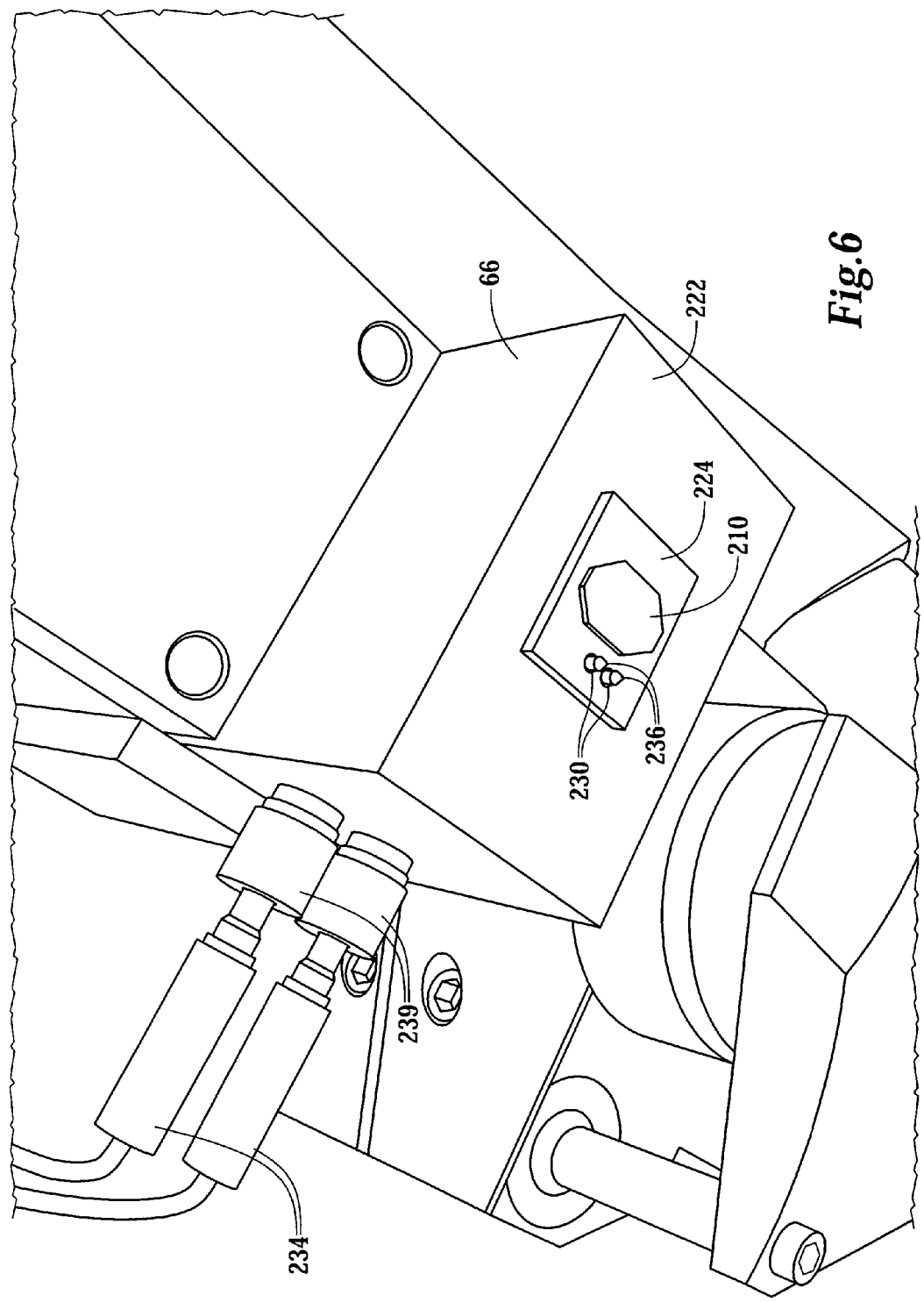
FIG. 6 is a bottom view of a tester.

Fore example, tester 60 may include a test block 66 which is an inductance tester, FIG. 6. Inductance test block 66 may include a secondary core 210 on a compressible mount 220. Inductance test block 6 may include two or more test pins 230. In another example, tester 60 may include a test block 66 which is a high potential test block, FIG. 7. High potential test block 66 may include two or more test pins 302.

Alternatively, tester 60 may include both inductance test block and high potential test block. As yet another alternative, test block 66 may function as a high potential test block, an inductance test block, or both, i.e., tester 60 may be able to test both inductance and high potential.

Tester 60, FIG. 1, may test circuit boards 100 and determine if a circuit board 100 passes electrical tests and is passed or approved for further manufacturing, use, processing, or sale. The testing machine may include a means of distinguishing between defective and approved circuit boards. For example, the testing machine may mark or code circuit boards so as to distinguish them as approved or defective, or the testing machine may store in computer memory or other computer readable media whether circuit boards passed or failed tests, e.g., software which records to a computer accessible media the which circuits are defective or software which records which circuits are approved.

Defective circuit boards 100 may be distinguished or identified by destroying them, e.g., using a drill 400 mounted to carriage 50. In another aspect of the invention, circuit boards 100 may be bar coded or marked with ink, paint, or a sticker which indicates or allows a computer to determine whether the circuit board passed or failed tests. In still another aspect of the invention, circuit boards 100 may be engraved, stamped, scratched, scored, or marked with an electrical arc or laser.

Testing machine 10 may include one or more controllers 600, FIG. 1, to coordinate the actions of carriage 50, drill 400, and testers 60. Controllers 600 may include dedicated controllers, industrial controllers, personal computers, industrial computers, interfacing hardware, control software, and operator interfaces.

The method may include the steps of moving carriage 50, FIG. 1, so that tester 60 is over circuit board 100 mounted or lying on a substrate which may be a table 52 or a jig 150. Carriage 50 then may move along an axis, e.g., the z-axis which may be generally perpendicular to the plane in which the circuit board and jig lie, so that tester 60 is in a predefined range for testing circuit board 100. This may involve a surface of tester 60 touching a surface of circuit board 100 or circuit 110 on circuit board 100. Tester 60 may electrically test circuit board 100. If tester 60 determines circuit board 100 passes electrical tests, circuit board 100 may be processed, used, or sold.

If testers 60, FIG. 1, determine that circuit board 100 is defective, controller 600 may direct carriage to move so that drill 400 is over circuit board 100. Drill 400 may then destroy circuit board 100.

After testing circuit board 100, FIG. 1, and determining if it passes electrical tests, carriage 50 may move so that tester 60 is positioned over another circuit board 102 so that testing may continue. This process may be repeated for additional circuit boards 102.

Testing machine 10 may be implemented as an upgrade to existing equipment, e.g., to provide or enhance testing capabilities. Alternatively, testing machine 10 may be implemented as a stand-alone machine.

2. Carriage

Carriage 50, FIG. 1, may be a movable with respect to circuit board 100 in one or more axes. Carriage 50 may allow one or more testers 60 to be mounted and moved with respect to a circuit board 100. Alternatively, carriage 50 may include integral testers. Carriage 50 may include a drill 400. Drill 400 may be able to rotate bits, e.g., drilling or routing bits, which may be able to destroy circuit boards which fail one or more tests implemented by testers.

For example, carriage 50, FIG. 1, may be a head from a CNC machine. The CNC machine may be able to translate, i.e., move, the carriage horizontally and vertically with respect to a substrate, which may be a table 52 or jig 150, on which circuit board 100 may be mounted. The CNC machine may have one or more axes and rails (not shown) along which carriage 50 may be translated. Carriage 50 may be translated along the rails by actuators (not shown). The actuators may drive lead screws (not shown) with may engage with threads (not shown) on carriage 50. When the lead screws are rotationally translated by the actuators, they may cause carriage 50 to be linearly translated. The actuators may be motors, e.g., DC servo motors, stepper motors, pneumatic motors, or pneumatic rams.

Alternatively, circuit board 100, FIG. 1, may be translated with respect to carriage 50 and testers 60. As yet another alternative, testing machine 10 may employ a combination of a movable carriage and a movable jig to translate circuit board 100 with respect to carriage 50 and testers 60.

For example, circuit boards 100, FIG. 1, may be mounted or lying on a jig 150 which may be mounted or lying on table 52. Table 52 may be movable in one or more axes, e.g., in the y-axis. Carriage 50 may be movable in the x-axis. So, circuit boards 100 on jig 150 may be accessible to a tester by a combination of movement of carriage 10 along the x-axis and jig 150 or table 52 along one the y-axis.

As another example, circuit board 100, FIG. 1, may be mounted and registered on jig 150, and may be translated in one or more axes, e.g., jig 150 may be moved on a conveyer belt so that circuit board 100 passes under tester 60 and drill 400. A controller 600 or computer 610 may translate tester 60 so that tester 60 is within testing range of circuit board 100 when circuit board 100 passes underneath tester 60. Tester 60 may perform one or more electrical tests. If tester 60 determines circuit board 100 has passed electrical tests, it may be further processed, sold, or used. If tester 60 determines circuit board 100 has failed one or more tests, controller 600, FIG. 1, or computer 610 may translate drill 400, FIG. 1, when circuit board 100 passes underneath drill 400 so that drill 400 destroys circuit board 100. Drill 400 may destroy circuit board by ablating sufficient material from circuit board 100 so that it is generally unserviceable, e.g., by using a router or drilling bit to make a hole or break in circuit board 100 or a circuit 110 on circuit board 100.

Testing machine 10, FIG. 1, may use one or more positional feedback systems 70 to determine the position of carriage 50 and tester 60 with respect to circuit board 100. Circuit board 100 or jig 150 may include location markers that may allow positional feedback system 54 to calibrate position with respect to circuit board 100 or jig 150. For example, position feedback system 54 may include one or more position sensors, e.g., optical encoders, or optical switches, or rotary encoders, to determine the position of carriage 50 as it is translated. Position feedback system 54 may include sensors, e.g., video cameras, optical scanners, bar code readers, electronic signature readers, or mechanical sensors, to coordinate the position of testers 60, carriage 50, and drill 400 with circuit boards 100 and jig 150.

Sensors also may detect circuit board or jig configuration and layout so that different types of jigs and circuit boards can be tested by the testing machine with little or no manual configuration by the operation. For example, an operator may load circuit boards onto jig 150 and a sensor may determine the type of circuit board or circuit board orientation on jig 150. Controller 600, FIG. 11, or computer 610 may automatically determine how to position tester 60 in order to test each circuit board 100. Tester controllers 620 may automatically determine how to best test circuit boards 100 based on predefined parameters which may be dependent on customer specifications, e.g., MIL-PRF-31032, MIL-PRF-5510, ISO 9001–2000, and other industry, consumer, and military specifications; circuit board material; and intended use. Alternatively, controller 600 or computer 610 may configure tester controller 620 to test circuit boards 100.

In one embodiment, the testing machine includes a CNC machine for carriage control and drive, e.g., a DYNAMOTION CNC machine. The CNC machine may include carriage with a drill, e.g., a single spindle SMART DRILL with an air bearing spindle. The CNC machine may include a magazine tool-change with 100 or more tools and a laser block to measure drill bit size, run out and length.

3. Substrate or Jig

Figure 4:
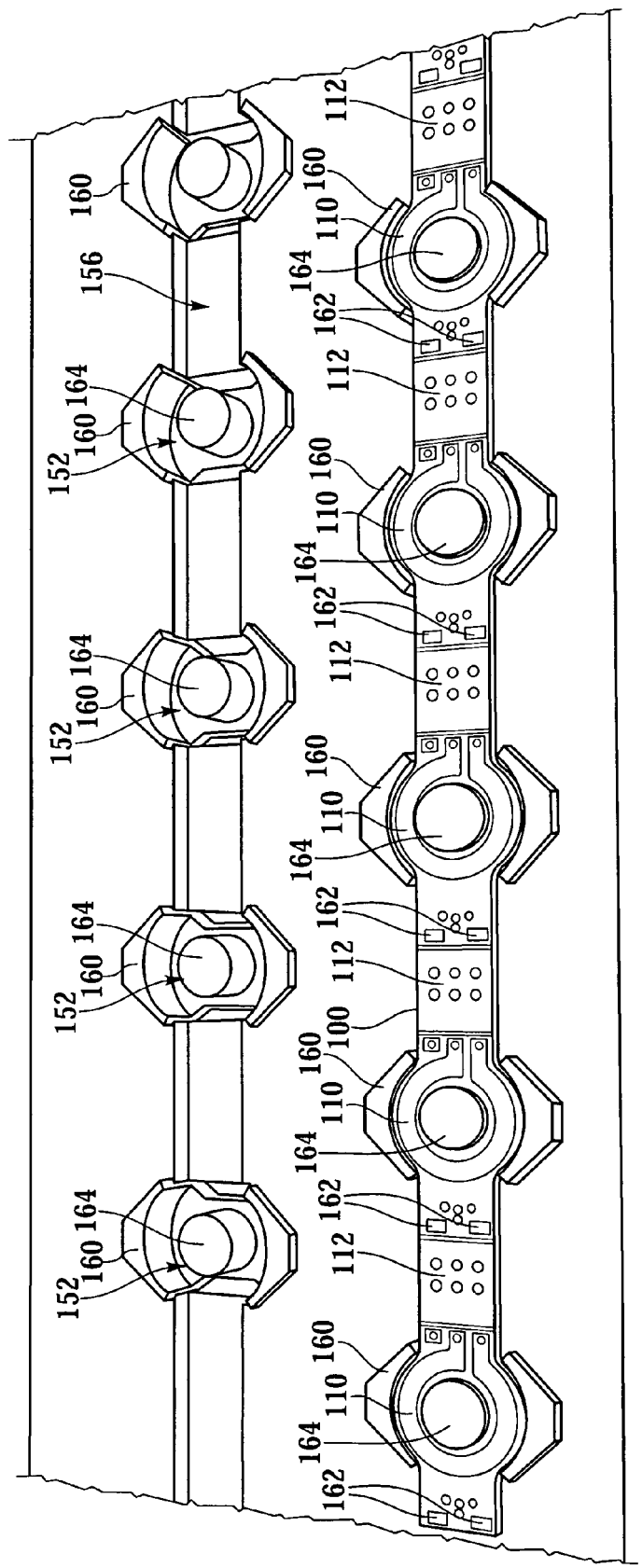
FIG. 4 is a view of a testing jig.
Figure 5:
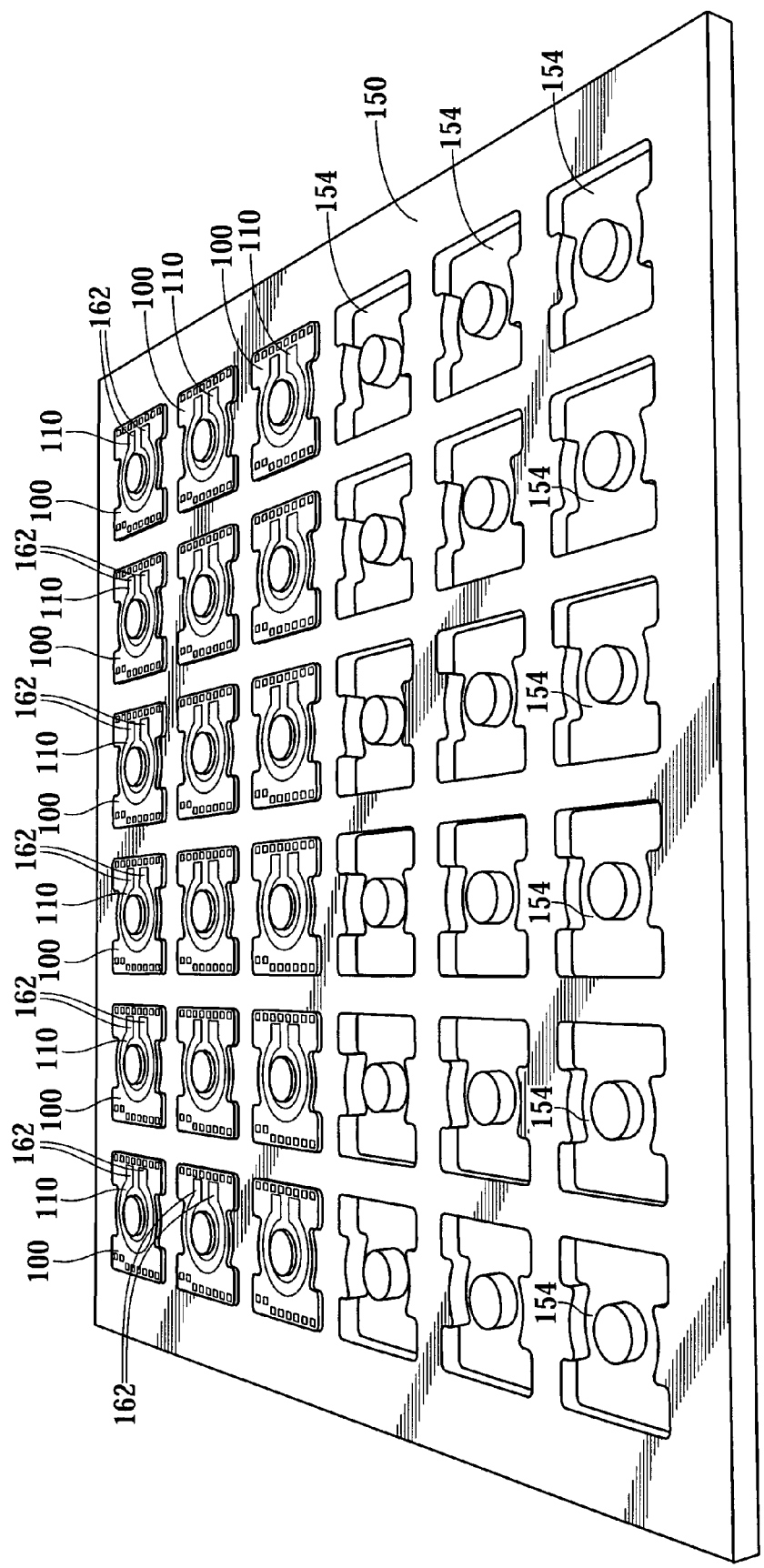
FIG. 5 is a view of an alternative testing jig.

Circuit boards 100, FIGS. 4 and 5, may be mounted to substrate, fixture, or jig 150. Jig 150 may have indentations, recesses, or beds, e.g., core beds 152 and circuit beds 154, sized to securely mount circuit board 100 in a fixed position. Jig 150 may be manufactured from a generally non-conductive material or insulator, e.g., a dielectric substrate.

Jig 150 may electrically isolate each core 160 from one another on jig 150. For example, the dielectric material of jig 150 may resist the transferring of electrical currents or magnetic fields from one core 160 to another core 160 on jig 150, i.e., the dielectric material of jig 150 may have a high dielectric constant sufficient to isolate circuits 110 and circuit boards 100 under tests herein.

Alternatively, each core bed 152 may be individually electrically isolated. For example, a sleeve of dielectric material may electrically isolate each core bed 152, or core beds 152 may form a sleeve, in which case sleeves or core beds 152 may be mounted to either a dielectric or non-dielectric substrate.

Example materials may include ceramics, porcelains, glasses, fiberglasses, plastics, and resin materials having high fiberglass content. For example, jig 150 may be manufactured from G10, a fiberglass resin with high fiberglass content.

Jig 150, FIGS. 3 and 4, may include one or more beds 152 for mounting cores 160. Jig 150 may include bridging beds 156 between each core bed 152 for receiving a bridging section 112 between each circuit board 100. Core beds 152 may be arranged in rows and columns on jig 150. Core beds 152 may be fabricated so as to receive an array of cores 160 and corresponding circuit boards 100 which are bridged, FIG. 4, or individual circuit boards, FIG. 5.

4. Cores

For example, cores may be press-fitted into jig 150 or cores 160 may be glued into jig 150. Cores 160 may be mounted to jig 150 using a compressible substrate, e.g., silicon adhesive or adhesive gaskets, which also may function as a compressible mount to level core 160 and absorb shocks during tester operation.

Core 160 may be mounted on table 52, jig 150, or integrated with circuit board 100, FIG. 4. For example core 160 maybe attached to jig 150 in core beds 152 so that the top surface of core 160 is level or above a top surface of jig 150. Core 160 may protrude between approximately 5 thousandths and approximately 50 thousandths of an inch above top surface 151 of jig 150, more specifically between approximately 10 thousandths and 30 thousandths on an inch, and still more specifically between approximately 15 thousandths and approximately 20 thousandths of an inch.

In another aspect of the invention, jig 150, FIG. 4, may support at least a portion of circuit board 100 so that circuit board 100 is in a position with respect to core 160 so as to maximally enhance an inductive field. For example, jig 150 may support circuit board 100 so that it is generally centered with respect to the height of a post 164 which may extent from the core 160 generally normal to jig 150. Circuit board beds 152 may be a raised, recessed, or otherwise designated portion of jig 150 supporting a portion or all each circuit board 100.

Core 160 may be a single piece core or may have multiple parts. For example, core 160 may include, but is not limited to, an E core, EC, ER, ETC, EER, PQ, EP, D, RM, post, plate, or pot core. Preferably, core 160 may be an E-type core, and specifically an RM core as shown in FIG. 3 (part 160), preferably with a matching plate 210. Alternatively, core 160 may be a post core.

Core 160 may be manufactured from ferrite or other suitable material with high magnetic permeability and low electrical conductivity which may enhance inductance in circuit 110 in the presence of an electrical current.

Core 160 may have a generally circular or oval shape with a major diameter between approximately 10 thousandths of an inch and approximately 6 inches, more specifically between approximately 20 thousandths of an inch and 2 inches, and still more specifically between approximately ½ inch and approximately 1 inch. Alternatively, core 160 may have a generally rectangular shape with a length between approximately 10 thousandths of an inch and approximately 6 inches, more specifically between approximately 20 thousandths of an inch and approximately 2 inches, and still more specifically between approximately ½ inch and approximately 1 inch. Cores may have a height between approximately 10 thousandths of an inch and approximately 4 inches, and more specifically between approximately 20 thousandths of an inch and approximately 2 inches, and still more specifically between approximately 3/16 inch and approximately ½ inch.

In one aspect, core 160 may have post 164 which is of a smaller diameter than circuit 110 so that post 164 may be received centrally by circuit board 100. Post 164 may have a height greater than the thickness of circuit board 100. Core 160 may partially surround circuit 110 and circuit board 100. In addition, circuit board 100 may have slots or holes (not shown) for receiving portions of core 160 not located within circuit 110.

5. Tester

One or more testers 60, FIG. 1, may be used to perform electrical tests on circuit boards 100. Tester 60 may be integrated into carriage 50, or tester 60 may be mounted to carriage 50. Alternatively, testing machine 10 may use multiple carriages and multiple testers to test circuit boards 100. Tester 60 may include a testing block 66, cables, contacts, leads, a measuring tool, interface boards, and controllers.

Tester 60 may be able to perform a single electrical test, e.g., inductance or high potential, or tester 60 may be able to perform multiple tests including inductance, high potential, capacitance, resistance, and conductance. For example, the measuring tool may be an inductance meter or a high potential or dielectric withstand meter.

Tester 60 may include a carriage adapter 62, FIG. 1. Carriage adapter 62 may be a plate that is attached to carriage 50. Carriage adapter 62 may be attached to carriage 50 using a secure means such as welds, rivets, bolts, or screws. For example, carriage adapter 62 may be attached to a front surface 64 of carriage 50 using one or more bolts.

Carriage adapter 62, FIG. 1, may be of such width to allow vertical clearance between a tester block 66 and carriage 50 so that the operation of one will not physically interfere with the operation of the other. For example, carriage 50 may include a drill 400; carriage adapter 62 may provide a vertical clearance between drill 400 and tester 60. For example, carriage adapter 62 may have a width between approximately 1 inch and approximately 6 inches, more specifically between approximately 2 inches and approximately 4 inches, and still more specifically approximately 3 inches.

Carriage adapter 62, FIG. 1, may be shaped and modified with mounting set points, mounting holes, and mounting adapters so as to securely attach to carriage 50. For example, tester 60 may be adapted to an existing PCB drilling machine or CNC machine. Carriage adapter 62 may be manufactured so that it will securely attach to an existing or new drilling machine, CNC machine, or other PCB manufacturing equipment. This may allow the CNC machines, e.g., PCB drilling machines, CNC tables, and CNC testers, to be upgraded with tester 60 by attachment of a carriage adapter 62 machined to securely attach to the manufacturing equipment. Carriage adapter 62 may allow manufacturing equipment to perform the original function with minimum impediment from tester 60 when tester 60 is deselected, not in use, or removed.

Carriage adapter 62 may be attached to a rail adapter 68, FIG. 1. Rail adapter 68 may be a planar plate that attaches to carriage adapter 62 on one planar surface and to a tester rail 70 on another planar surface. Carriage adapter 62 and rail adapter 68 may be attached using a secure means such as welds, rivets, bolts, or screws. Alternatively, rail adapter 68 may be directly attached to carriage 50. Tester rail 70 may be mounted to rail adapter 68 or, alternatively, to carriage adapter 62.

Tester rail 70, FIG. 1, may consist of two or more rails which move independently of one another in along a single axis. For example, tester rail 70 may be formed from a first rail 72 which may attach to tester rail adapter 68. A second rail 74 may attach to first rail 72. First 72 and second 74 rails may be joined at a rail track 76. Rail track 76 may be a grove in first rail 72 or second rail 74 which allows a portion of one rail to engage with the other rail by seating partially inside the other rail within rail track 76. First rail 72 and second rail 74 may move independently of one another along an axis parallel to rail track 76. Rail track 76 may have one or more rail stops which limit the range of movement of one rail with respect to the other rail. Rail track 76 may include ball bearings, linear bearings, or low friction surfaces which enhance the ability of one rail to move independently of the other rail within rail track 76.

Tester rail 70, FIG. 1, may be attached to a tester head mounting plate 78. Tester head mounting plate 78 may have a first section 80 and a second section 82. First section 80 of tester head mounting plate 78 may be generally planar and lie in a plane parallel to the z-axis of carriage 50. For example, second rail 74 of tester rail 70 may be attached to first section 80 of tester head mounting plate 78. Tester rail 70 and tester head mounting plate 78 may be orientated such that tester head mounting plate 78 may move in an axis generally parallel to the z-axis of carriage 50. First section 80 of tester mounting plate 78 may be mounted to tester rail 70 using a secure means such as rivets, welds, bolts, or screws.

Second section 82 of tester head mounting plate 78, FIG. 1, may be generally planar in geometry and may lie in a plane generally perpendicular to and below first section 80 of tester head mounting plate 78. First section 80 and second section 82 of tester head mounting plate 78 may be attached together using a secure means such as welds, rivets, bolts, or screws. Alternatively, tester head mounting plate 78 may be manufactured from a single piece of material so that first section 80 and second section 82 are of an uninterrupted piece of material. For example, tester head mounting plate 78 may be molded or cast from a single block of material.

An actuator 84 may engage with tester head mounting plate 78, FIG. 1. Actuator 84 may mount to an actuator mounting plate 86 which may be a generally planar plate lying in a plane generally perpendicular to the z-axis and above carriage 50. Actuator 84 may engage tester head mounting plate 78 with a tester ram 88. Tester ram 88 may extend from the bottom of actuator 84 generally along the z-axis so that tester ram 88 may engage with the top of tester head mounting plate 78. The extension of tester ram 88 may translate tester head mounting plate 78 along the z-axis so as to select tester 60. Tester ram 88 also may contract. Contraction of tester ram 88 may deselect tester 60 by translating along the z-axis away from circuit board 100. Actuator 84 may extend and contract tester ram 88 using a pneumatic cylinder, servo motor, linear drive, or a stepper motor. Tester ram 88 may extend, and thus translate tester block 66 from the deselected position to the selected position, a predetermined distance, e.g., a tester ran stroke length. Tester ram stroke length may be between approximately ½ inch and approximately 10 inches, more specifically between approximately 2 inches and approximately 8 inches, and still more specifically between approximately 3 inches and approximately 5 inches.

In one embodiment, a CNC machine carriage, e.g., a DYNAMOTION machine with a single spindle SMART DRILL, is modified so that the existing spindle is removed and replaced with a LENZ z-axis assembly which may allow clearance to mount testers to the carriage and allows translation along the z-axis. Adapting a replacement z-axis assembly which has sufficient clearance may require mechanical and electrical modifications to the existing CNC machine. For example, the replacement z-axis assembly may require setting up and wiring the z-axis assembly into the existing CNC machine position feedback system. A DC servo amplifier may have to be setup and calibrated. In addition, the CNC control system, including control software, frequency converters, and drive hardware, may require calibration, tuning, and testing.

The replacement z-axis assembly may require mechanical modifications to allow fitting of the tester. In one embodiment, the z-axis assembly, e.g., a LENZ z-axis assembly, is disassembled and one or more holes are drilled so a tester may be mounted.

For example, the tester may be a tool holder magazine, e.g., a DYNAMOTION tool holder magazine, which may include mechanical guide rails and a tester ram that can be used to lift and lower the tester, selecting and deselecting the tester, respectively. The mechanical guide rails may include bearings, e.g., linear bearings. In addition to raising and lowering the assembly, the tester ram may provide the shock absorption when the tester block engages with the circuit board, thus functioning as a compressible air bladder to cushion engagement and account for slight undulations in the jig.

Control of the tester ram 88 may be integrated into controller 600, i.e., the CNC controller. For example, air lines may be connected to tester ram 88 and an air solenoid and regulator (not shown) may be electrically connected to outputs of controller 600 so that controller 600 may activate the air solenoid.

6. Tester Block

Figure 7:
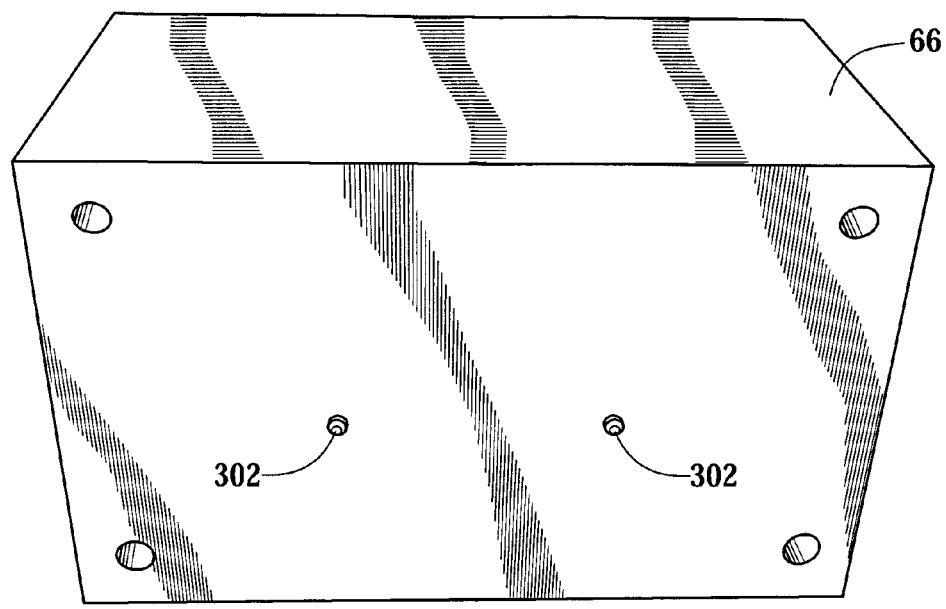
FIG. 7 is a bottom view of a high potential tester.

Tester block 66, FIGS. 6 and 7, may be of a generally rectangular geometry. Tester block 66 may be of non-rectangular geometries also. The geometry and size of tester block 66 may be in part determined by the geometry of circuit board 100 and the geometry of circuits 110 on circuit board 100. For example, circuit board 100 may include mounted components. In this case, tester block 66 may have geometry which may not disturb or contact circuits, components, or other circuit boards which are not being tested by testers 60 when tester block 66 translates over circuit boards 100 or engages circuits 110 or circuit boards 100.

Tester block 66 may attach to tester head mounting plate 78, FIG. 1, either directly or through a block adapter plate 90. For example, tester block 66 may have an upper surface which may attach to block adapter plate 90 which may have a generally planar geometry and may lie in a plane generally perpendicular to the z-axis. In turn, block adapter plate 90 may attach to second section 82 of tester head mounting plate 78, so that tester block 66 lies below tester head mounting plate 78.

Tester block 66 may be manufactured from a generally non-conductive material or insulator. Such material may have a high dielectric constant. Example materials may include ceramics, porcelains, glasses, fiberglasses, plastics, and resin materials having high fiberglass content. For example, tester block 66 may be manufactured from G10, a fiberglass resin with high fiberglass content.

Figure 8:
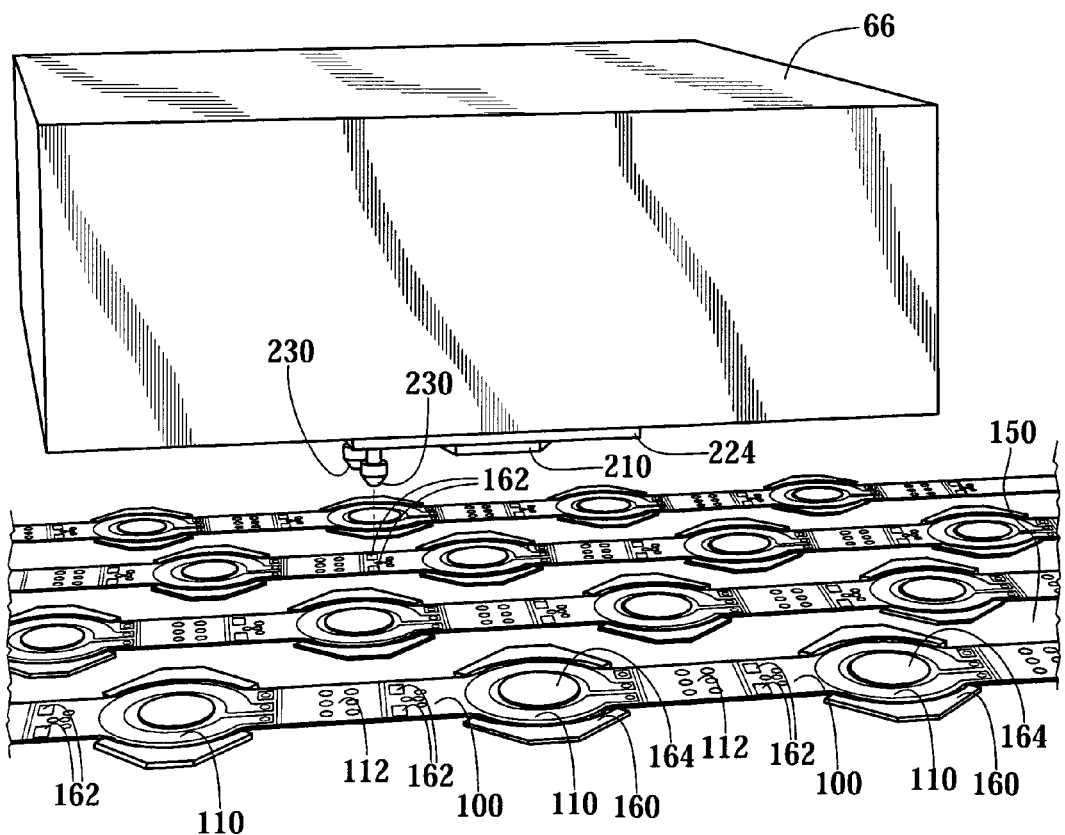
FIG. 8 is a side view of an inductance tester and a jig.

Tester block 66, FIG. 8, may be translated along the z-axis so that it engages circuit board 100. The extension of tester ram 88 may cause tester block 66 to translate along the z-axis so that it is in testing range or proximity of circuit board 100. Translation of tester block 66 may involve translation of both carriage 50 and extension of tester ram 88. Also, the translation of carriage 50 along the z-axis may cause carriage adapter 50, rail adapter 68, tester rail 70, tester head mounting plate 72, block adapter plate 90, and thus tester block 66 to translate in along the z-axis.

For example, tester ram 88, FIG. 1, may select tester block 66 by extending and translating tester block 66 toward circuit board 100. Carriage 50 may translate toward circuit board 100 along the z-axis. When tester block 66 contacts circuit board 100, circuit board 100 may resist further translation and continued translation by carriage 50 along the z-axis may cause tester ram 88 to be compressed. Compression of tester ram 88 may signal controllers 600 or computer 610 that tester block 66 has engaged circuit board 100. Signaling of controller 600 may be through an engagement switch 92 mounted independently of tester head mounting plate 78 such that movement of tester head mounting plate 78 with respect to first rail 72 of tester rail 70 may cause engagement switch 92 to signal controller 600. Engagement switch 92 may be a mechanical switch or an optoelectrical switch.

Alternatively, tester block 66 may be attached to carriage 50 directly or through a mounting adaptor and z-translation of carriage 50 may be used to select and deselect tester block 66. A switch may be use to determine when tester block 66 has engaged with circuit board 100 For example, an optical or mechanical sensor may detect when tester block 66 has made contact with circuit board 100. Alternatively, feedback positioning system 54 may detect when tester block 66 has been translated to a position which engage tester block 66 with circuit board 110.

In one embodiment, the tester may be mounted on a linear rail assembly, e.g., a DYNAMOTION tool holder magazine. The tool holder magazine may include one or more optoelectrical switches, e.g., a primary optoelectrical switch and a backup optoelectrical switch. The optoelectrical switches may be calibrated and positioned on the tool holder magazine so that engagement of the tester block with the circuit board may trigger the one or more of the optoelectrical switches, creating a engagement signal, i.e., a test trigger pulse, which may be sent to a controller, e.g., the CNC controller, to start, i.e., trigger, a testing cycle.

Tester block 66, FIG. 1, may include or more electrical testers. For example, a tester block 66 may include an inductance tester or a high potential tester. In another aspect of the invention, tester block 66 may include a resistance tester and a capacitance tester.

In one aspect of the invention, tester block 66 may include a shoe (not shown). The shoe may engage circuit board 100 during testing to hold it securely in place and help prevent damage to circuit board due to misalignment. For example, the shoes may be one or more strips of compressible material, e.g., rubber or spring mounted bars, which engage with a circuit board 100 and jig 150 as tester block 66 translates toward circuit board 100 in the z-axis. The shoes may partially flatten, or level, circuit board 100 to the surface of jig 150.

In another aspect of the invention, tester block 66 may include one or more cleaner nozzles (not shown). The cleaner nozzles may blow air or spay a cleaning fluid across the surface of a circuit board or tester block. The air or cleaning fluid may clean the surface and dislodge foreign matter which may interfere in testing. For example, the cleaner nozzles may blow air having a pressure at the nozzle tip between approximately 5 psig and approximately 20 psig. In another aspect of the invention, testing machine 10 may include a cleaning brush (not shown) to remove foreign material from circuit boards 100, tester block 66, jig 150, or cores on tester block 66.

6.1 Inductance Tester

Tester block 66 may include an inductance tester. In one aspect of the invention, tester block 66 may be an inductance tester block, FIG. 1. In another aspect on the invention, the inductance tester may be included in tester block 66 along with one or more other testers.

Inductance tester may include a plate 210 which may be mounted to raised area 224 of tester block 66, FIG. 6. The plate may be manufactured from ferrite or other suitable material with high magnetic permeability and low electrical conductivity which may enhance an inductive field about circuit board 100 or circuit 110 in the presence of an electrical current. Plate 210 may engage with core 160 when tester block 66 is translated along the z-axis, and plate 210 and core 160 may together form a core assembly with circuit board 100 as shown in exploded view in FIG. 3.

Alternatively, plate 210 and core 160 may be interchanged. For example, plate 210 may be mounted to the substrate, e.g., jig 150, and core 160 may be mounted to tester block 66.

In still another aspect, testing machine 10 may not include plate 210. For example, core 160 may be a post core and may be mounted to tester block 66. Core 160 may be received by circuit board 110 so core 160 is translated so as to be positioned generally centrally within circuit 110 in circuit board 100.

Core 160, FIG. 3, and plate 210, FIG. 6, may be mounted on a compressible mount 220. For example, plate 210 may be mounted to compressible mount 220 which in turn may be mounted to a bottom face 222 of tester block 66. Bottom face 222 of tester block 66 may include a raised area 224 on which plate 210 or compressible mount 220 may be mounted. Raised area 224 may be generally planar, and raised area may be generally rectangular or follow, at a scale, the perimeter of secondary core 210. Raised area 224 may extend beyond bottom face 222 of tester block 66 between approximately ¹⁄₁₆ inch and 1 inch, more specifically between approximately ⅛ inch and approximately ½ inch, and preferably approximately ³⁄₁₆ inch.

Compressible mount 220, FIG. 6, may be compressible so that when tester block 66 engages circuit board 100 or plate 210 engages or contacts core 160, compressible mount 220 may compress along the z-axis. Compressible mount 220 also may allow plate 210 to level so that it lies in the same plane as circuit board 100. For example, if core 160 is present, the contact of plate 210 and core 160 may compress compressible mount 220 so that plate 210 and core 160 lie in the same plane and make level contact with each other which may increase testing accuracy.

Circuit board 100 and jig 150 may be on table 52, FIG. 1, which may be level. However, undulations in table 52 may cause circuit board 100 or core 160 to not align properly with tester block 66. Misalignment may result in small air gaps between core 160, plate 210, and circuit board 100. Such air gaps may cause error in testing circuit board 100. This may lead to some circuits being falsely determined as defective or being falsely determined as passing. The compression of compressible mount 220, FIG. 2, during engagement of tester block 66 with circuit board 100 and core 160 with plate 210, may level and align core 160, tester block 66, circuit board 100, and plate 210 so that small air gaps may be removed or reduced.

Alternatively, compressible mount 220 may be placed between tester block 66 and tester head mounting plate 78 or tester block adapter plate 70, and plate 210 may be attached directly to bottom face 222 of tester block 66. So, engagement of tester block 66 with circuit board 100 or core 160 with plate 210 may cause tester block 66 to compress compressible mount 220 against tester block adapter plate 90 or tester head mounting plate 78. The compression of compressible mount 220 may allow tester block 66 to align, level, and properly engage with circuit board 100.

Compressible mount 220, FIG. 2, may be manufactured of a compressible material that is generally non-conductive and non-magnetic. If compressible mount 220 is too thick, it may allow translation in axes other than the z-axis when compressible mount 220 is compressed. If it is too thin, it may not compress sufficiently and may allow tester block 66 to over-translate in the z-axis before engagement switch 92 signals controller 600 or computer 610 to stop z-translation. In addition, if compressible mount 220 is too thin, it may not allow tester block 66 or secondary core 210 to properly level and align with respect to circuit board 100 and core 160. Also, a too thin compressible mount 220 may not proper absorb mechanical shocks when tester block 66 engages circuit board 100 or core 160 engages secondary core 210; excessive mechanical shocks may damage circuit board 100 or testers 60. Over-translation along the z-axis also may damage circuit board 100, tester 60, tester block 66, core 160, secondary core 210, and test pins 230.

In one embodiment, compressible mount 220, FIG. 2, is manufactured from a compressible material having an uncompressed thickness between approximately $1/32$ and approximately $1/4$ inch, more specifically between approximately $3/64$ and approximately $1/8$ inch, and still more specifically approximately $1/16$ inch thick. Materials that compressible mount 220 may be manufactured from include but are not limited to neoprene rubber, silicone rubber, urethane nitrile, butyl rubber, and non-conductive foams.

Alternatively, compressible mount 220, FIG. 2, consists of springs mounted to the primary core and the tester block. The springs may be metallic, e.g., spring steel, or of a polymeric material with sufficient springiness to absorb contract shock from core engagement and promote level core engagement.

Tester block 66 may include two or more test leads or test pins 230, FIG. 2. Engagement of tester block 66 with circuit board 100 may cause test pins 230 to make contact with contact pads 162 on circuit board 100. Test pins 230 may be spring loaded 238 so that if compressible mount 220 is compressed along the z-axis, test pins 230 may compress so as to not over-translate along the z-axis. Over-translation of test pins 230 against circuit board 100 may damage circuit board 100, test pins 230, or tester block 66. Tester block 66 may have pin wells 232, FIG. 6. Pin wells 232 may be of a larger diameter than pins 232 so test pins 230 may recess into tester block 66.

Test pins 230, FIG. 2, may form a conductive path between contact pads 162 on circuit board 100 and two or more test cables 234, FIG. 1. A test connector 239, FIG. 2, e.g., a banana plug, may receive test cables 234 and complete an electrical connection to test pins 232. Test cables 234 may form a conductive path to a tester controller 620, FIG. 11, e.g., inductance tester controller 622. Test pins 230, FIG. 8, may have conical tips 236 which make contact with circuit board contact pads 162. Conical tips 236 may localize engagement pressure of tester block 66 or the expansion force of test pin springs 238 in a small area so that test pins 230 make an electrical connection with contact pads 162 which has a very low electrical resistance. Test pins 230 may have other geometries which may make good electrical contact with contact pads 162, e.g., spherical test pins.

Figure 11:
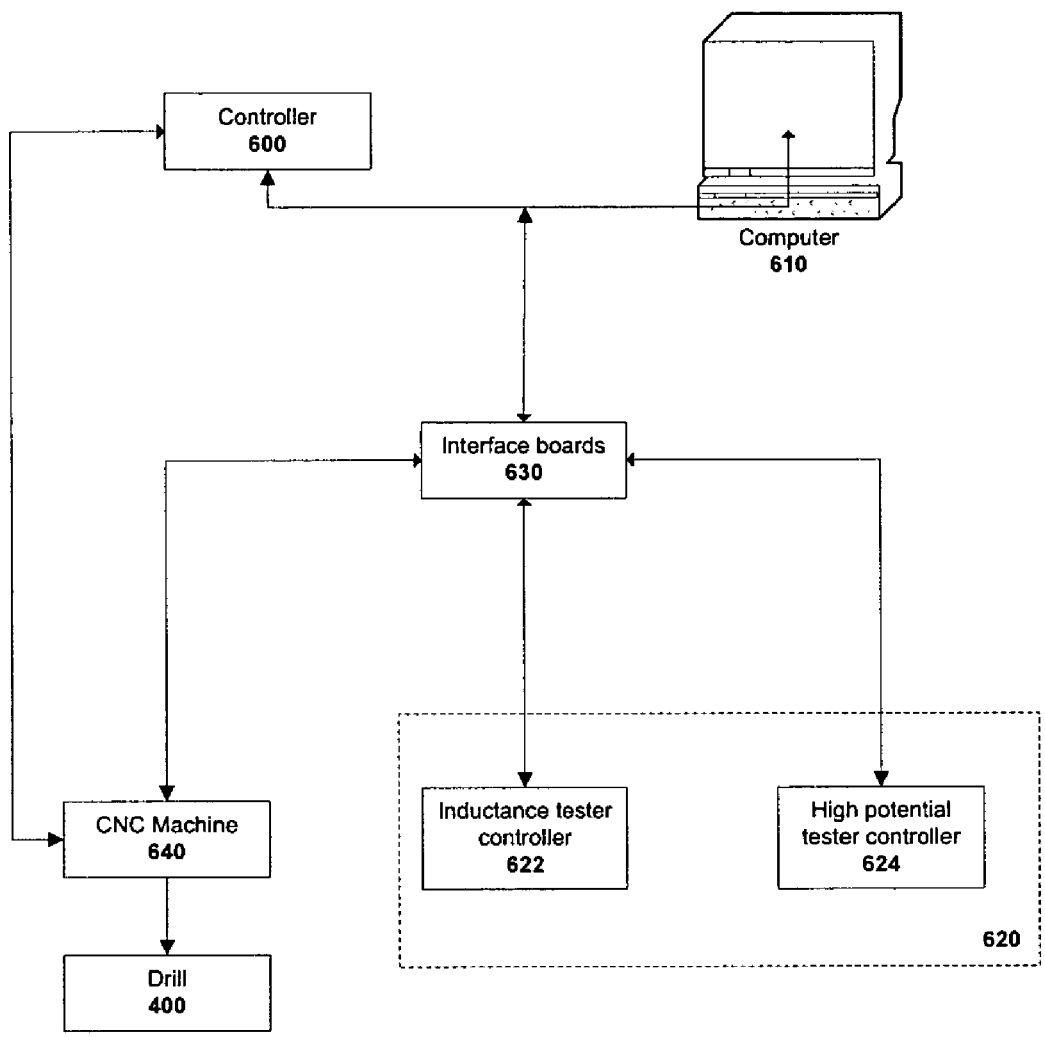
FIG. 11 is a block diagram of a testing system in accordance with the invention.

Inductance tester controller 622, FIG. 11, may pass an electrical current through circuit board 100 and circuit 110 via test pins 230 and contact pads 162 on circuit board 100. Inductance tester controller 622 may perform electrical tests on circuit board 100 when tester block 66 engages circuit board 100 and inductance tester controller 622 may determine whether circuit board 100 is defective or approved, i.e., fails or passes inductance tests.

The inductance tester may be a combination inductance, capacitance, and resistance tester, e.g., a HEWLETT PACKARD PRECISION LCR unit. The inductance tester may perform one or more electrical tests. For example, the inductance tester may test inductance, conductivity, resistance, or capacitance.

The inductance tester may require one or more interfaces to the CNC controller or computer. For example, the inductance tester may be designed for component sorting and may produce a part measured low, or PML, and part measured high, or PMH, signal after testing each circuit board. Inductance tests for circuit boards may allow a minimum and maximum inductance specification. If circuit board inductance falls with in the minimum and maximum specification, the circuit board may pass the test. Otherwise, the circuit board may fail the inductance test and not be approved. The PML and PMH levels for the inductance tester may be set to the circuit board passing inductance specifications; so that a PMH or PML signal will indicate that the circuit board under test falls outside the passing inductance range. The PMH and PML signals may be combined as a single signal to the CNC controller or computer to indicate that the circuit passed or failed the inductance test.

Figure 9A:
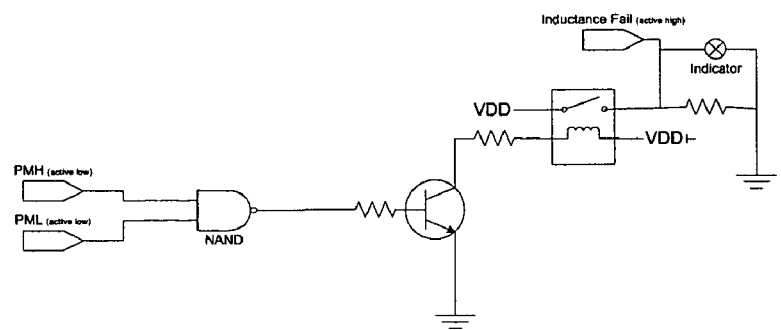
FIG. 9A is a circuit schematic of a relay and fault test interface board.

The PMH and PML signals may be combined using a relay and fault test board. The relay and fault test board may combine the PMH and PML signals using an AND gate, NAND gate, or equivalent logic. In one embodiment, the PMH and PML signals are combined using a NAND gate. The NAND gate may interface to the controller or computer, or may drive a transistor, relay, and inverters or buffer logic to provide compatible drive levels, e.g., 24 volts, and electrical isolation with the controller 600 or computer 610, FIG. 6. The relay and fault test board may deliver a bad part test signal to the controller or computer when the circuit board fails the inductance test. The relay and fault test board may signal an operator when a board fails a test, e.g., a buzzer or light. A circuit is shown in FIG. 9A for interfacing the PML and PMH signals to a controller or computer.

The inductance tester may produce a measurement or test result signal, i.e., a pass or fail signal, for the circuit board under test which may be delayed from the test. A trigger control board may condition and synchronize the test signal with the CNC controller or computer so that test signals are sent neither prematurely nor too late.

Figure 9B:
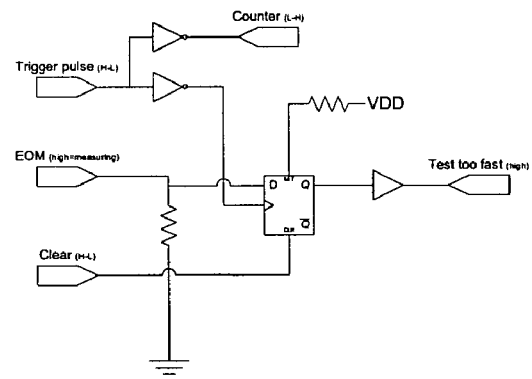
FIG. 9B is a circuit schematic of a speed check and test faulty interface board.

For example, the trigger control board may include an AND gate, inverter, and positive edge triggered D-type flip flop. The AND gate may combine the engagement or test trigger pulse from optoelectrical switches 94, an end of measurement signal from the controller 600, FIG. 11, or computer 610, and the bad part test signal from the relay and fault test board. The trigger control board may include inverts, buffers, transistors, and relays to provide compatible drive levels, e.g., 24 volts, and electrical isolation with the CNC controller or computer. The controller 600 or computer 610 may produce a clear test signal which may clear, or reset, a bad part test signal from the trigger control board. A circuit is shown in FIG. 9B for interfacing optoelectrical switches 94, end of measurement signal, and bad part test signal with the controller or computer.

Inductance tester 200 may include a speed check and test faulty interface board. The speed check and test faulty interface board may synchronize the controller or computer and tester to prevent the controller or compute from running too fast or becoming unsynchronized and starting to test a second circuit board before tests on a first circuit board are complete.

For example, under normal conditions, the machine may be designed so that a new trigger, or engagement pulse, should not be produced by optoelectrical switches 94, FIG. 1, before an end of measurement signal is produced for the circuit board currently under test by the inductance tester. If this were to occur, controller 600, FIG. 11, may be running the machine too fast and the inductance tester may still be testing the circuit board under test.

Figure 9C:
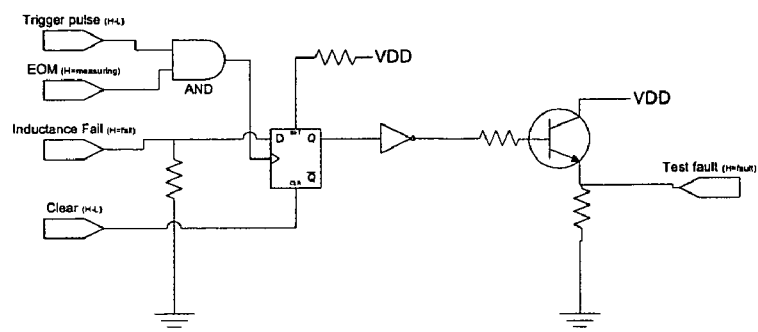
FIG. 9C is a circuit schematic of a trigger interface board.

The speed check and test faulty board may include a positive edge triggered flip flop and one or more inverters, buffer logic, transistors, diodes, and relays to provide compatible drive levels, e.g., 24 volts, and electrical isolation with the controller 600 or computer 610, FIG. 11. The flip flop may trigger a fault or test too fast condition if a trigger pulse is received while end of measurement signal is still at a logic level which indicates testing is under way. The interface board may cause a signal, e.g., an audible alarm or visual indicator, to be sent to an operator should a fault occur. A circuit is shown in FIG. 9C detecting testing faults or testing too fast conditions.

6.2 High Potential Tester

Tester block 66 may include a high potential tester. In one aspect of the invention, tester block 66 may be a high potential tester block, FIG. 7. In another aspect of the invention, tester block 66 may include the high potential tester and one or more other testers.

The high potential tester may include test leads or test pins 302, FIG. 7. When tester block 66 translates along the z-axis, test pins 302 may contact circuit board 100, e.g., at contact pads 162 on circuit board 100, FIG. 8. Continued translation of carriage 50, FIG. 2, may cause tester ram 88 to compress which may cause engagement switch 92 to signal controller 600 or computer 610 that test pins 302 have contacted circuit board 100, thus engaging tester block 66 with circuit board 100. Controller 600, FIG. 11, may stop translation of tester block 66, FIG. 2, toward circuit board 100 or reverse the direction of translation. As with inductance tester 200, test pins 302 may be spring loaded and may recess into pin wells 232 to prevent damage to circuit board 100 or high potential tester 300 if tester block 66 is over translated along the z-axis toward circuit board 100.

Test pins 302, FIG. 7, may have a conductive path to test cables 234, FIG. 1, which may form a conductive path to high potential tester controller 624, FIG. 11. Referring to FIGS. 1, and 7, high potential tester controller 624 may pass a high potential electrical current through circuit board 100 via test pins 230 and contact pads 162 on circuit board 100. High potential tester controller 624 may pass a high potential electrical current through circuit board 100 via test pins 302 at other areas of circuit board 100 other than contact pads 162, e.g., to test substrate dielectric withstand. High potential tester controller 624 may perform electrical tests, e.g., dielectric withstand, on circuit board 100 when tester block 66 engages circuit board 100, and high potential tester controller 624 may determine whether circuit board 100 is defective or approved, i.e., fails or passes high potential tests.

The voltage potential of the electrical current used by high potential tester controller 624, FIG. 11, may be between approximately 1,000 volts and approximately 30,000 volts, more specifically between approximately 1,200 volts and approximately 10,000 volts, still more specifically between approximately 1,500 volts and approximately 6,000 volts. In one embodiment, voltage potential is between approximately 2,000 volts and approximately 3,000 volts, and preferably approximately 2,200 volts. In one embodiment, high potential tester 300 may ramp voltage between one or more predetermined voltages.

High potential tester controller 624, high potential tester 300, tester block 66, and test cables 310, FIGS. 1 and 7, may include insulation, safety interlocks, and insulated wire guides. For example, test cables 310 may be capable of withstanding high voltages, e.g., 30,000 volts. One or more test cables 310 may be able potential source lines, and one or more test leads 310 may be return lines. Test cables 310 may pass through wire guides 320 between tester block 66 and high potential tester controller 624. Wire guides 320 may protect test cables 310 and also may prevent outside electrical or magnetic interference with tester signals. Wire guides 320 may include wire conduits. Wire conduits may be manufactured from a protective material which may be non-conductive. For example, wire conduits may be manufactured from plastic pipe such as PVC, ABS, polyurethane, or TEFLON pipe.

The high potential tester controller 624, FIG. 11, may be a HYPOT III AC/DC withstand voltage tester, manufactured by ASSOCIATED RESEARCH, model 3665. The high potential tester controller 624 may test between approximately 2,000 and approximately 3,000 volts. The high potential tester controller 624 may be able to measure residual current flow in a circuit board under test. Residual current flow measurement may be used to determine if test pins 302 have engaged with test contacts 162 properly. The high potential tester controller 624 may be able to measure residual current flow in AC more or in DC mode. The high potential tester controller 624 may allow setting of the test voltage, ramp time, and current flow. The high potential tester controller 624 may include multiple tester inputs so that one high potential tester controller may test multiple circuit boards and tester blocks, e.g., a machine with multiple tester heads may test multiple circuit boards at the same time or one tester may operate multiple tester machines.

The high potential tester 300 may include an interface board 630, FIG. 11. Interface board 630 may interface pass and fail signals for tests to controller 600 or computer 610. In addition, interface board 630 may synchronize high potential tester controller 624 and the controller 600 or computer 610. Furthermore, interface board 630 may include safety interlocks or may interface safety interlock signals between high potential tester 300 and controller 600 or computer 610.

Interface board 630 may include one or more relays to provide compatible drive levels, e.g., 24 volts, and electrical isolation with the CNC controller or computer. For example, the high potential tester interface board may interface reset, test, fail, safety interlock, and tester head select functions from controller 600 or computer 610 to high potential tester controller 624 and testing machine 10.

7. Drill

Drill 400, FIG. 1, may be mounted to carriage 50 or may be integrated into carriage 50. Drill may include a spindle 410 and one or more air supply lines 420. Drill 400 may be translated over circuit board 100 by carriage 50. Carriage 50 may be translated along the z-axis toward circuit board 100, so that drill 400 may be translated toward circuit board 100. In one embodiment, drill 400 is a DYNAMOTION single spindle SMART DRILL with an air bearing spindle.

Carriage 50, FIG. 1, may include a pressure foot 430 mounted in a plane generally parallel to circuit board 100 and between circuit board 100 and carriage 50. A pressure foot cylinder may extent a pressure foot ram attached to pressure foot 430 which may translate pressure foot 430 along the z-axis toward circuit board 100.

In order to drill circuit board 100, FIG. 1, carriage 50 may extend drill 400 toward circuit board 100 along the z-axis. The pressure foot ram may extend pressure foot 430 toward circuit board 100 so that pressure foot 430 may be in close proximity to circuit board 100 along the z-axis. Drill 400 may include a bit, e.g., a drill bit or router bit, which may destroy at least a portion of circuit board 100 which may include a portion of circuit 110. Preferably, drill 400 may destroy circuit 110 by ablating sufficient material from circuit board 100 to open circuit 110. Pressure foot 400 may include a debris removal system 58 which may remove material ablated from circuit board 100 by drill 400. Drill 400 may use a spindle 410 to rotate a bit in order to destroy circuit board 100.

8. Controllers

The invention may use one or more controllers to coordination and control the movement and actions of components of the testing machine, i.e., automate the machine and testing. The controllers 600 may be a CNC controller, FIG. 11, a personal or industrial computer 610, or a combination. Components under the control of controllers may include a CNC machine 640, carriage 50, tester block 66, inductance tester controller 622, high potential tester controller 624, drill 400, and tester ram 88. One controller may control multiple components, e.g., a single controller may control carriage 50 and drill 400. Alternatively, one or more controllers may be slaved to another controller or a computer.

For example, a personal computer 610, FIG. 11, may control a controller 600 or may directly control machine 640. Personal computer 610 or CNC controller 600 may control carriage 50 and drill 400. Furthermore, personal computer 610 or CNC controller 600 may control one or more tester controllers.

Tester controllers may include inductance tester controller 200, FIG. 11, and high potential tester controller 300. Interface boards 630 may interface tester controllers and one or more other controllers.

Controller 600 may be a SIEB and MEYER CNC controller. CNC controller 600 may control drill 400, CNC machine 640, drill 400, and carriage 50. Interface boards 630 may allow testers 60 to be interfaced with controller 600 or personal computer 610.

Software on computer 610 or controller 600 may direct and synchronize the actions of the testing machine 10 and tester controllers in response to operation choices, testing results, and jig or circuit layout, and circuit board type and specifications.

9. Test Operation

Figure 10:
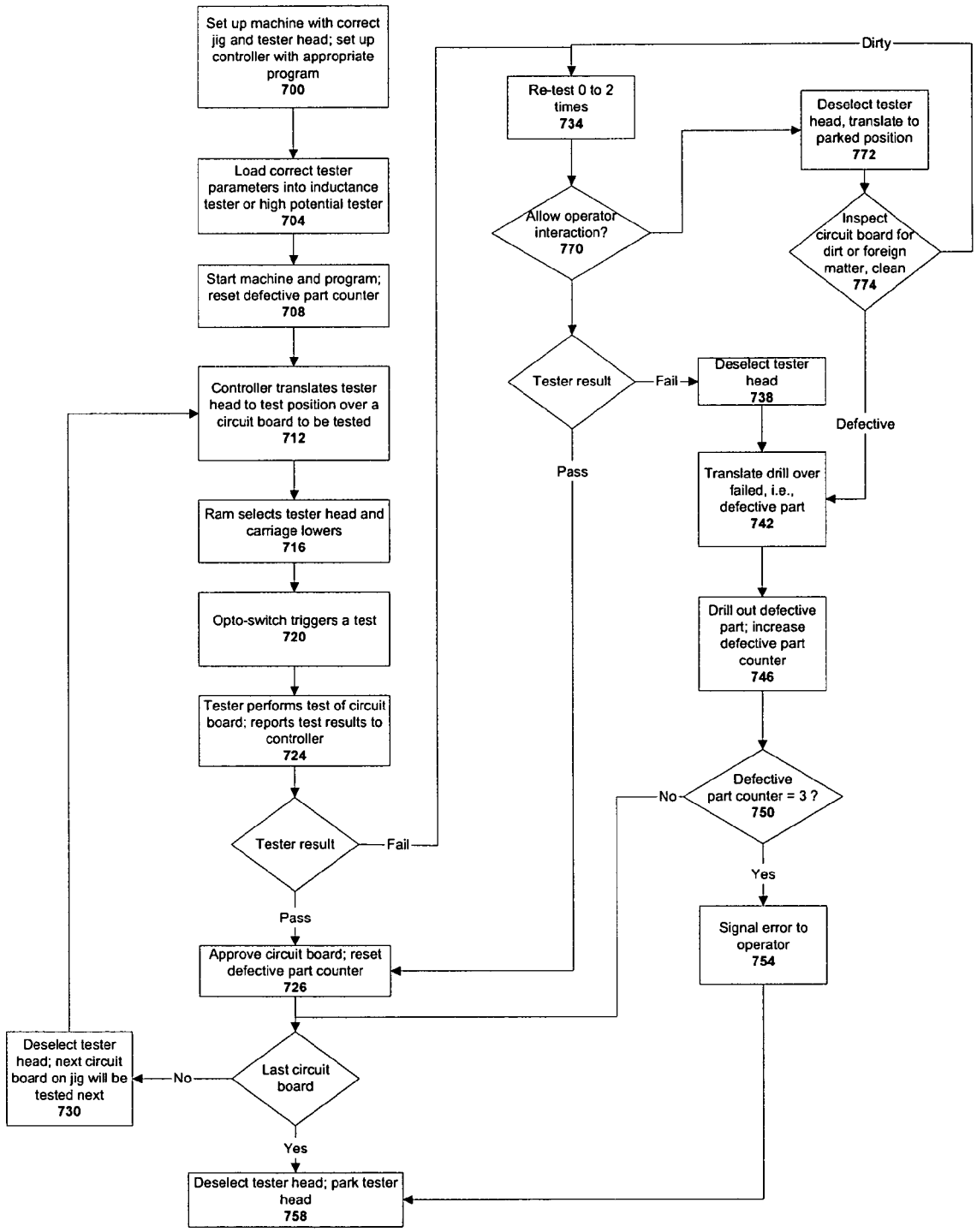
FIG. 10 is a block diagram of a method of testing in accordance with the invention.

An example operation sequence of testing machine 10 is shown in block form in FIG. 10. An operator may set up a test machine 10 with jig 150, tester 60, circuit boards 100, FIG. 1, and load a program on controller 600 or computer 610, FIG. 11 (step 700, FIG. 10). Tester 60, e.g., inductance tester 200 or high potential tester 300, may be loaded with testing parameters which may define testing limits for determining whether a circuit board is approved or defective (step 704, FIG. 10). The program may be started (step 708, FIG. 10), referring to FIG. 8, carriage 50 may be translated by CNC machine 640 so that tester block 66 is over a circuit board 100 on jig 150 (step 712, FIG. 10). Controller 600 may cause tester ram 88 to extend so that tester block 66 is translated along z-axis toward circuit board 100, selecting tester block 66, FIG. 1. Carriage 50 also may be translated along the z-axis so the tester block 66 engages circuit board 100 (step 716, FIG. 10).

Carriage 50 may continue extending after tester block 66 engages circuit board 100, FIG. 1. Compressible mount 220, FIG. 6, may be compressed, which, if plate 210 is present, may level plate 210 with respect to core 160 or circuit board 100, FIG. 8. Since tester block 66 may be unable to translate any further because of circuit board 100, it may force tester ram 88 to compress, FIG. 1. This may cause opto-switch 94 to sense that first rail 72 has moved with respect to second rail 74 of tester rail 70. This may cause an engagement signal, or trigger pulse, to be sent to controller 600 or computer 610, e.g., via interface board 630, FIG. 11 (step 720, FIG. 10).

Controller 600, computer 610, or interface boards 630, FIG. 1, may cause inductance tester controller 622 or high potential tester 624 to conduct electrical tests (step 724, FIG. 10). If circuit board 100 passes electrical tests, (step 726, FIG. 10), tester ram 88 may contract, deselecting tester block 66, and carriage 50 may translate tester block 66 away from circuit board 100 along the z-axis (step 730, FIG. 10), disengaging from circuit board 100. Carriage 50 then may be translated so that tester block 66 is over another circuit board 100, FIG. 1 (step 712, FIG. 10) and may continue to conduct electrical tests on other circuit boards 100.

If circuit board 100 does not pass electrical tests, controller 600 or computer 610 may cause circuit board 100 to be tested one or more additional times (step 734, FIG. 10). If circuit board 100, FIG. 1, passes additional electrical tests, circuit board 100 may be approved (step 726, FIG. 10) and testing of other circuit boards may continue.

If circuit board 100, FIG. 1, fails the additional tests, controller 600 or computer 610 may cause circuit board 100 to be destroyed. Alternatively, controller 600 or computer 610 may cause circuit board 100 to be destroyed after failing electrical tests the first time without additional testing.

Alternatively, if circuit board 100 fails electrical tests, controller 600 or computer 610 may notify an operator and deselect and park tester (step 772, FIG. 10). Controller 600 or 610 may have a settable flag or option determining whether to allow operator interaction (step 770, FIG. 10). The operator may inspect circuit board 100 for dirt and clean circuit board 100 (step 774, FIG. 10). The operator may direct controller 600 or computer 610 to destroy circuit board 100 (step 742–746, FIG. 10) or retest circuit board 100 (step 734, FIG. 10). The operator may make this selection using an input device, e.g., a keyboard or one or more buttons or switches.

If circuit board 100 fails electrical tests and controller 600 or computer 610 or the operator determines to destroy circuit board 100, controller 600 or computer 610, FIG. 11, may deselect tester 60 (step 738, FIG. 10) and translate carriage 50 so that drill 400 is over defective circuit board 100 (step 742, FIG. 10). Drill 400 then may destroy circuit board 100 or render it generally unserviceable by ablating material from defective circuit board 100 (step 746, FIG. 10).

Destroying defective circuit board 100 may increase a consecutive defective circuit board counter. If the consecutive defective circuit board counter exceeds a preset limit (step 750, FIG. 10), controller 600 or computer 610 may signal the operator as to a possible machine malfunction (step 754, FIG. 10). Controller 600 or computer 610 then may deselect and park tester 60 (step 758, FIG. 10). The preset consecutive defective circuit board limit may be entered by an operator or determined according to the circuit board type being testing. For example, the preset consecutive defective circuit board limit may be between 1 and 4, and preferably 3. Otherwise, if the consecutive defective circuit board counter does not exceed the preset consecutive defective circuit board limit, testing machine 10 may continue testing other circuit boards.

Testing machine 10 may test every circuit board 100 on jig 150 or a sampling of circuit boards 100. For example, high potential testing may be harmful to circuit board 100 or may alter the electrical or physical characteristics of circuit board 100, whereas inducatance testing generally may not. So, testing machine 10 may inductance test most circuit boards 100 but high potential test a smaller proportion of circuit boards 100.

For example, during the development of a circuit board from a prototype stage to full production, most or all prototype boards may be high potential tested in order to determine design criteria important for proper board operation, e.g., dielectric withstand of substrate and possible arcing points. However, once the design criteria are determined, e.g., boards manufactured according to the design criteria generally pass high potential testing, only samples or a small proportion of the circuit boards manufactured may be high potential tested.

In one aspect of the invention, a defective circuit board 100 may be examined or analyzed to determine if a design flaw is responsible for the failure of circuit board 100 to pass the electrical tests. For example, if circuit board 100 fails high potential testing or inductance testing, examination of circuit board 100 may reveal a flaw in board design or choice of board materials. The design may be revised and the flaw eliminated, removed, or a work-around for the flaw may be determined. Circuit boards may be produced which do not have the design flaw. Circuit boards produced from the modified design, or subsequent designs which do not include the flaw, may not require individual testing.

10. Conclusion

While the foregoing written description of the invention enables one of ordinary skill to make and use what is considered presently to be the best mode thereof, those of ordinary skill will understand and appreciate the existence of variations, combinations, and equivalents of the specific exemplary embodiments and methods herein. The invention should therefore not be limited by the above described embodiments and methods, but by all embodiments and methods within the scope and spirit of the invention as claimed.

We claim:

1. A system for inductance testing a plurality of planar magnetic circuits, comprising:
   a substrate;
   a plurality of cores spaced and electrically isolated from one another and mounted on said substrate, wherein each one of said plurality of cores registers with a corresponding one of said plurality of planar magnetic circuits;
   a carriage moveable on one or more axes with respect to said plurality of planar magnetic circuits;
   a pair of leads, wherein said leads are mounted to said carriage;
   a controller, which coordinates the actions of said carriage and said leads so as to implement testing;
   wherein said controller selects one of said plurality of planar magnetic circuits and contacts said pair of leads with said selected planar magnetic circuit and delivers an electrical current through said selected planar magnetic circuit while the corresponding registered core enhances inductance in said selected planar magnetic circuit;
   wherein, after said selected planar magnetic circuit is tested, said controller positions the leads so that another planar magnetic circuit may be tested; and
   an inductance measuring tool.

2. A system according to claim 1, further comprising a plurality of beds in said substrate for registering said plurality of planar magnetic circuits with said plurality of cores.

3. A method for inductance testing a board having a planar magnetic circuit and a pair of contacts, comprising the steps of:
   providing a substrate having an electrically isolated core and bed;
   loading said board on said bed to register said planar magnetic circuit with said core;
   providing a pair of leads and a plate;
   contacting said pair of leads with said pair of contacts and said plate with said core using a controller;
   delivering an electrical current through said planar magnetic circuit while said plate and said core enhance inductance in said planar magnetic circuit;
   measuring inductance in said planar magnetic circuit; and
   determining whether said inductance is in a predetermined range, and
   marking said board if said inductance is not in said predetermined range.

4. A method according to claim 3, further comprising:
   analyzing said board to identify a defect if said inductance is not in said predetermined range;
   and improving a design of said hoard to overcome said defect.

5. A method according to claim 3 wherein said marking step is accomplished by drilling said board to prevent use of said board and to provide a visible indicator of the non-functional condition of the board.

6. A method for inductance testing a board having a planar magnetic circuit and a pair of contacts, comprising the steps of:
   registering said planar magnetic circuit with an electrically isolated core;
   providing a plate complementary to said core;
   contacting said plate with said core;
   providing a pair of leads;
   positioning said pair of leads into contact with said pair of contacts using actuation and control;
   delivering an electrical current through said planar magnetic circuit while said plate and said core enhance inductance in said planar magnetic circuit;
   measuring said inductance in said planar magnetic circuit; and
   determining whether said inductance is in a predetermined range.

7. The method of claim 6, further comprising the step of approving said board if said inductance is in said predetermined range.

8. A method according to claim 7 wherein said approved board is further processed, used or sold.

9. The method of claim 6, further comprising the step of disapproving said board if said inductance is not in a predetermined range.

10. The method of claim 9 further comprising the step of marking said disapproved board.

11. A method according to claim 10 wherein said marking step is accomplished by drilling said board to prevent use of said board and to provide a visible indicator of the non-functional condition of said board.

12. The method according to claim 6 wherein said actuation is accomplished using at least one motor.

13. The method according to claim 6 wherein said steps are repeated to test a plurality of boards.

14. A method for inductance testing a plurality of boards, each of said boards having a planar magnetic circuit and a pair of contacts, comprising the steps of:
 (a) providing a substrate having a plurality of electrically isolated cores and beds;
 (b) loading said boards on said beds;
 (c) registering said planar magnetic circuits with said cores;
 (d) providing a pair of leads and a plate, wherein said leads and said plate are mounted on a carriage;
 (e) positioning said carriage in the proximity of a selected one of said boards using actuation and control;
 (f) contacting said pair of leads with said pair of contacts of said selected board using actuation and control;
 (g) contacting said plate with said core registered with said selected board using actuation and control;
 (h) delivering an electrical current through said planar magnetic circuit of said selected board while said plate and said core enhance inductance in said planar magnetic circuit of said selected board;
 (i) measuring said inductance in said planar magnetic circuit of said selected board;
 (j) repeating steps (d) through (h) for each remaining one of said boards, until all of said boards have been tested.

15. The method of claim 14, further comprising the step of approving said boards having an inductance in a predetermined range.

16. A method according to claim 15 wherein said approved boards are further processed, used or sold.

17. The method of claim 14, further comprising the step of disapproving said boards not having an inductance in a predetermined range.

18. A method according to claim 17 further comprising marking said disapproved boards.

19. A method according to claim 18 wherein said marking step is accomplished by drilling said disapproved boards to prevent use of said disapproved boards and to provide a visible indicator of the non-functional condition of said disapproved boards.

20. The method according to claim 14 wherein said actuation is accomplished using at least one motor.

* * * * *

UNITED STATES PATENT AND TRADEMARK OFFICE
CERTIFICATE OF CORRECTION

PATENT NO. : 7,243,038 B2
APPLICATION NO. : 10/821083
DATED : July 10, 2007
INVENTOR(S) : David A. Dowland and J. Brent Nolan It is certified that error appears in the above-identified patent and that said Letters Patent is hereby corrected as shown below:

Column 2, line 23, the word "circuits" should be changed to --circuit--; line 50, "the" in "magnetic circuit the said core", should be changed to --of--.

Column 4, line 55 and column 5, line 65, "FIG. 1" should be changed to --FIG. 11--.

Column 5, line 20, delete "a" from the text "may be a movable".

Column 7, line 2 and column 10, line 59, "G10" should have no bolded text; line 35, "extent" should be changed to --extend--.

Column 9, line 56, "ran" should be changed to --ram--.

Column 11, line 23, "use" should be changed to --used--; line 24, there should be a period following "engaged with circuit board 100"; line 29, "110" should be changed to --100--; line 58, "spay" should be changed to --spray--.

Column 13, line 17, "proper" should be changed to --properly--; line 49, "232" should be changed to --230--.

Column 14, line 43, "9A" should have all bolded text; line 63, "9B" should have all bolded text.

Column 15, line 2, "compute" should be changed to --computer--; line 24, "9C" should have all bolded text.

Column 17, lines 22 and 23, "coordination" should be changed to --coordinate--.

Column 19, line 59, claim #1, "carnage" should be changed to --carriage--.

UNITED STATES PATENT AND TRADEMARK OFFICE
CERTIFICATE OF CORRECTION

PATENT NO. : 7,243,038 B2
APPLICATION NO. : 10/821083
DATED : July 10, 2007
INVENTOR(S) : David A. Dowland and J. Brent Nolan It is certified that error appears in the above-identified patent and that said Letters Patent is hereby corrected as shown below:

Column 20, lines 27 and 28, claim #3, the text "marking said board if said inductance is not in said predetermined range." should follow "and" on line 27 rather than beginning a new line; lines 32 and 33, claim #4, the "and" beginning line 33 should be placed after "range;" on line 32; line 33, in claim #4, "hoard" should be changed to --board--; line 62, claim #9, "a" should be changed to --said--.

Signed and Sealed this

Twenty-first Day of August, 2007

JON W. DUDAS
*Director of the United States Patent and Trademark Office*